United States Patent
Basu et al.

(10) Patent No.: US 9,263,260 B1
(45) Date of Patent: Feb. 16, 2016

(54) NANOWIRE FIELD EFFECT TRANSISTOR WITH INNER AND OUTER GATES

(71) Applicant: International Business Machines Corporation, Armonk, NY (US)

(72) Inventors: Anirban Basu, Lagrangeville, NY (US); Guy M. Cohen, Ossining, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/571,348

(22) Filed: Dec. 16, 2014

(51) Int. Cl.
| | | |
|---|---|---|
| *H01L 21/20* | (2006.01) | |
| *H01L 21/335* | (2006.01) | |
| *H01L 21/00* | (2006.01) | |
| *H01L 29/772* | (2006.01) | |
| *H01L 29/775* | (2006.01) | |
| *H01L 21/02* | (2006.01) | |
| *H01L 51/00* | (2006.01) | |

(52) U.S. Cl.
CPC ........ *H01L 21/0259* (2013.01); *H01L 51/0048* (2013.01)

(58) Field of Classification Search
CPC .............. H01L 29/785; H01L 29/0669; H01L 51/0048; H01L 29/1606; H01L 29/772
USPC ...................... 257/282, 9, 24, 27, 29; 438/151
See application file for complete search history.

(56) References Cited

U.S. PATENT DOCUMENTS

| | | |
|---|---|---|
| 7,301,199 B2 | 11/2007 | Lieber et al. |
| 7,498,211 B2 | 3/2009 | Ban et al. |
| 7,859,028 B2 | 12/2010 | Ban et al. |
| 8,007,727 B2 | 8/2011 | Shalev et al. |
| 8,241,913 B2 | 8/2012 | Shalev et al. |
| 8,318,505 B2 | 11/2012 | Shalev et al. |
| 2006/0125025 A1* | 6/2006 | Kawashima ........... B82Y 10/00 257/401 |
| 2006/0246497 A1* | 11/2006 | Huang ............... G01N 27/4146 435/6.14 |
| 2007/0148857 A1 | 6/2007 | Ban et al. |
| 2008/0128760 A1* | 6/2008 | Jun ........................ B82Y 10/00 257/280 |
| 2008/0191196 A1* | 8/2008 | Lu .......................... B82Y 10/00 257/27 |
| 2009/0057762 A1* | 3/2009 | Bangsaruntip ......... B82Y 10/00 257/347 |

(Continued)

FOREIGN PATENT DOCUMENTS

| | | |
|---|---|---|
| TW | 201332110 A1 | 8/2013 |
| WO | 2013/128456 A1 | 9/2013 |

OTHER PUBLICATIONS

Delker et al., "1/f Noise Sources in Dual-Gated Indium Arsenide Nanowire Transistors", IEEE Transactions on Electron Devices, vol. 59, No. 7, Jul. 2012, Digital Object Identifier 10.1109/TED.2012. 2194150, pp. 1980-1987.

*Primary Examiner* — Vongsavanh Sengdara
*Assistant Examiner* — Thai T Vuong
(74) *Attorney, Agent, or Firm* — Jinesh Patel; Louis J. Percello

(57) ABSTRACT

A semiconductor device comprising a suspended semiconductor nanowire inner gate and outer gate. A first epitaxial dielectric layer surrounds a nanowire inner gate. The first epitaxial dielectric layer is surrounded by an epitaxial semiconductor channel. The epitaxial semiconductor channel surrounds a second dielectric layer. A gate conductor surrounds the second dielectric layer. The gate conductor is patterned into a gate line and defines a channel region overlapping the gate line. The semiconductor device contains source and drain regions adjacent to the gate line.

11 Claims, 13 Drawing Sheets

(56) References Cited

U.S. PATENT DOCUMENTS

| | | |
|---|---|---|
| 2009/0146208 A1 | 6/2009 | Ban et al. |
| 2009/0250757 A1* | 10/2009 | Takahashi ......... H01L 21/28097 257/348 |
| 2009/0294805 A1 | 12/2009 | Shalev et al. |
| 2010/0193770 A1* | 8/2010 | Bangsaruntip ......... B82Y 10/00 257/24 |
| 2011/0095267 A1* | 4/2011 | Bryant ................... B82Y 10/00 257/24 |
| 2011/0133163 A1* | 6/2011 | Bangsaruntip ......... B82Y 10/00 257/24 |
| 2011/0133164 A1* | 6/2011 | Bangsaruntip ......... B82Y 10/00 257/24 |
| 2011/0133280 A1* | 6/2011 | Bangsaruntip .... H01L 29/78696 257/347 |
| 2011/0315950 A1* | 12/2011 | Sleight .................. B82Y 10/00 257/9 |
| 2012/0007051 A1* | 1/2012 | Bangsaruntip ......... B82Y 10/00 257/24 |
| 2012/0037880 A1* | 2/2012 | Bangsaruntip ......... B82Y 10/00 257/9 |
| 2013/0207079 A1* | 8/2013 | Sleight ................. H01L 29/775 257/24 |
| 2013/0313524 A1 | 11/2013 | De Micheli et al. |

* cited by examiner

US 9,263,260 B1

NANOWIRE FIELD EFFECT TRANSISTOR WITH INNER AND OUTER GATES

BACKGROUND

The present invention relates generally to semiconductor fabrication, and more particularly, to nanowire field effect transistor (NFET) structures and methods of fabrication.

Nanotechnology has gained widespread use in the semiconductor industry as a way to meet scaled technology requirements. For example, nanowires are currently being used to form the channel regions in field-effect transistors (FETs).

SUMMARY

Embodiments of the present invention disclose a method, and a nanowire semiconductor device with inner and outer gates. A semiconductor device comprising a suspended semiconductor nanowire inner gate and a first epitaxial dielectric layer which surrounds a nanowire inner gate. The first epitaxial dielectric layer surrounds an epitaxial semiconductor channel. The epitaxial semiconductor channel further surrounds a second dielectric layer. A gate conductor surrounds the second dielectric layer, where the gate conductor is patterned into a gate line and defines a channel region overlapping the gate line. The semiconductor device contains source and drain regions adjacent to the gate line.

DETAILED DESCRIPTION

Figure 1:
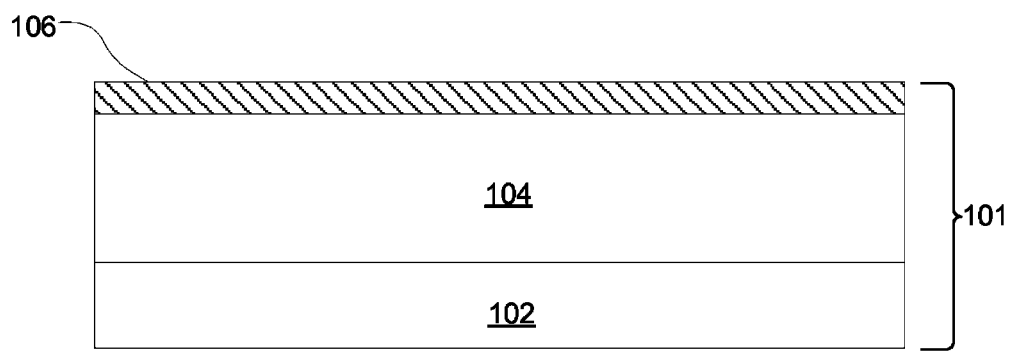
FIG. 1 is cross sectional schematic view depicting a starting wafer of a semiconductor device, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

In nanowire FETs with an outer gate-all-around structure, the charge centroid and the maximum leakage point in the sub-threshold regime is the center of the nanowire. In the sub-threshold regime, if one can move the charge centroid and the maximum leakage point to the outer channel region and thus, get closer to the gate, it may lead to improved gate control over the nanowire channel and thus, lead to better control of short-channel effects.

In order to form the above-mentioned structure, one needs to epitaxially deposit the inner gate dielectric atop the inner gate electrode and then the epitaxially deposit the nanowire channel atop the inner gate dielectric such that the channel is crystalline. The above-mentioned structure cannot be implemented in Si/SiGe material system for NFETs because, in spite of bandgap difference between Si and SiGe, the conduction band offset is essentially zero. Therefore, it is not possible to form an inner gate dielectric in the Si/SiGe material system.

FIG. 1 is cross sectional schematic view depicting a starting wafer of a semiconductor device, according to an embodiment of the present disclosure. Substrate 101 comprises of a host wafer 102, a dielectric film 104, and a thin layer of a single-crystal semiconductor 106. It should be noted that the drawings provided are not to scale and the exemplary thickness of the layers may vary where the thickness described is not meant to limit the scope of the disclosure. The host wafer 102 may range in thickness from 1000 to 600 microns, the dielectric film 102 may range in thickness of 0.1 micron, and the semiconductor layer 106 may be 0.01 to 0.05 microns thick.

In an embodiment, the host wafer 102 can be a silicon (Si) wafer, and the dielectric film 104 may be silicon dioxide ($SiO_2$). The single-crystal semiconductor layer 106 can be a III-V semiconductor such as indium gallium arsenide (InGaAs), indium arsenide (InAs), or gallium antimonide (GaSb). Since the dielectric film 104 is placed under III-V layer 106 it is also referred to as a buried oxide (BOX).

The substrate 101 can be formed by techniques known in the art, such as wafer bonding, and layer transfer. Utilizing such techniques, the single-crystal semiconductor layer 106 may be first epitaxially grown on a native donor substrate. For example, in an embodiment in which the single-crystal semiconductor layer 106 is chosen to be $In_{0.53}Ga_{0.47}As$, it may be epitaxially grown on an indium phosphide (InP) substrate. It should be noted that a person having ordinary skill in the art will recognize that InP is said to be a native substrate for $In_xGa_{1-x}As$ since, at an indium content of x=0.53, the two materials are lattice matched. Furthermore, lattice matching of the single-crystal semiconductor layer 106 with respect to the donor wafer does not need to be maintained if the single-crystal semiconductor layer 106 is kept below a critical thickness. The critical thickness may be defined as the layer thickness below which the lattice mismatched between the layer and the substrate is accommodated by elastic strain. Furthermore, if the layer thickness exceeds the critical thickness some of the strain may be relieved by the formation of dislocation. The formation of dislocations (plastic deformation) is typically undesired.

The single-crystal semiconductor layer 106 may be heavily doped so it may be used as a conductive gate material. In an embodiment, doping of the single-crystal semiconductor layer 106 may be achieved using impurities that substitute a group III or a group V atom. For example, in an embodiment in which the single-crystal semiconductor layer 106 is composed of $In_{0.53}Ga_{0.47}As$, impurities such as silicon (Si), tin (Sn), selenium (Se), and tellurium (Te) may be used to make a n-type semiconductor in which majority carriers would be electrons. Carbon (C), beryllium (Be), or zinc (Zn) may be used to make a p-type doped semiconductor in which a majority carriers would comprise holes.

In an embodiment, the host wafer 102 with a dielectric film 104 formed thereon may be bonded to the single-crystal semiconductor layer 106. Using the previous example, the host wafer 102 may be composed of silicon. The dielectric film 104 may be composed of $SiO_2$. The dielectric film 104 may be bonded to the single-crystal semiconductor layer 106, which may be composed of $In_{0.53}Ga_{0.47}As$. The bonding may be in the form of a covalent bond formed between the surface of the dielectric film 104 and the single-crystal semiconductor layer 106. In an embodiment, the single-crystal semiconductor layer 106 may be formed on a donor substrate (not shown), composed of, for example InP, which may then be removed, leaving the single-crystal semiconductor layer 106 bonded to the dielectric layer 104. The resulting substrate 101 may be referred to as a semiconductor-on-insulator substrate. Removal of the donor substrate may be done by etching or by a method known in the art as SmartCut™. The SmartCut™ method relies on an ion implantation of hydrogen and annealing to induce the separation of the donor wafer from the transferred layer.

Figure 2A:
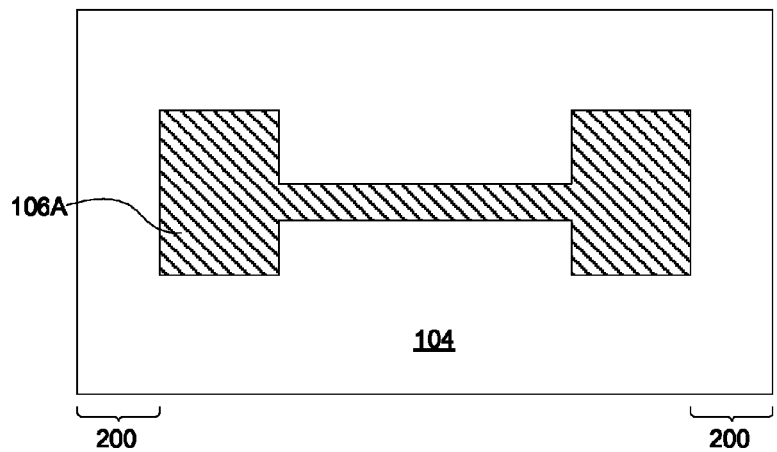
FIG. 2A is a top view and FIG. 2B is a cross sectional schematic view depicting a process for forming a patterned layer on semiconductor device, according to an embodiment of the present disclosure.
Figure 2B:
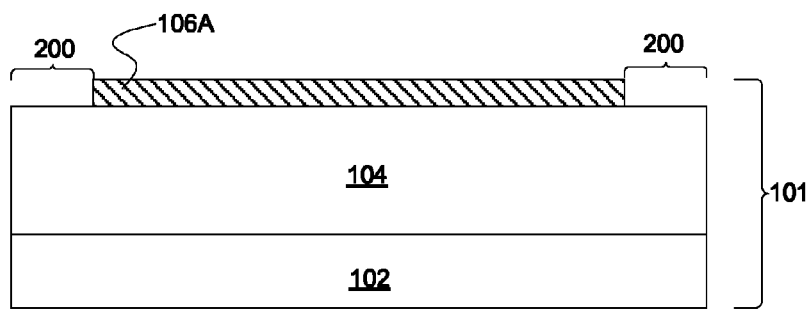

FIG. 2A is a top view and FIG. 2B is a cross sectional schematic view depicting a patterned layer on semiconductor device, according to an embodiment of the present disclosure. The single-crystal semiconductor layer 106 (FIG. 1) may be patterned as shown in the top view of FIG. 2A to form a patterned single-crystal semiconductor layer 106A. In an embodiment, the definition and patterning of the single-crystal semiconductor layer 106 (FIG. 1) may be done by techniques know in the art, such as lithography and reactive ion etching (RIE). The RIE process chemistry may be preferably chosen to have etching selectivity with respect to dielectric layer 104. After the patterned single-crystal semiconductor layer 106A is formed, the dielectric film 104 may be exposed at region 200 where the single-crystal semiconductor layer 106 was etched.

Figure 3A:
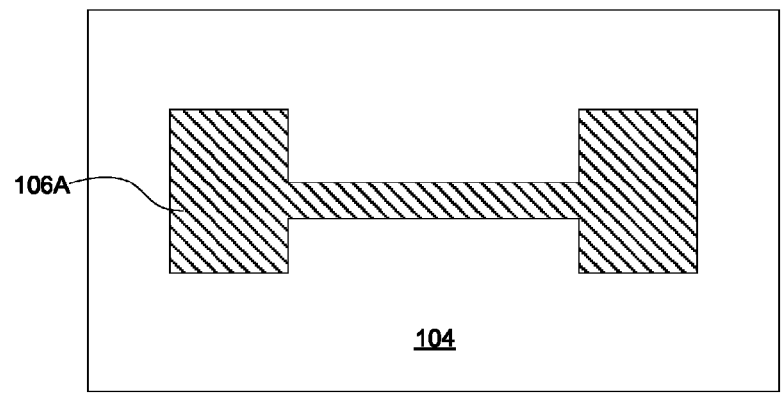
FIG. 3A is a top view and FIG. 3B is a cross sectional schematic view depicting a partial etching process and suspension of a layer on semiconductor device, according to an embodiment of the present disclosure.
Figure 3B:
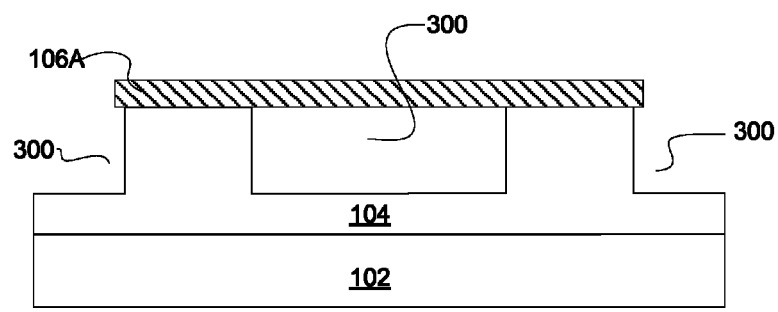

FIG. 3A is a top view and FIG. 3B is a cross sectional schematic view depicting a partial etching process and suspension of a layer on semiconductor device, according to an embodiment of the present disclosure. In an embodiment, the dielectric layer 104 may be partially etched below the patterned single-crystal semiconductor layer 106A, thereby creating a support opening 300 to allow the suspension of a center portion of the patterned single-crystal semiconductor layer 106A. The dimensions of the etching depth of dielectric film 104 may be calculated based on a width of the patterned single-crystal semiconductor layer 106A, according to the embodiment of the invention. For example, if the patterned single-crystal semiconductor layer 106A has a width $W_{301}$, then dielectric layer 104 may be laterally etched to undercut the dielectric by at least half of the width $W_{301}$ of the patterned single-crystal semiconductor layer 106A. The etching dimension may be represented as the following:

$$ED = \frac{w}{2} \qquad \text{Eq. 1}$$

where ED represents the etching dimensions and w represents the width of the patterned single-crystal semiconductor layer 106A. In an embodiment in which the dielectric film 104 is composed of $SiO_2$, diluted hydrofluoric acid (DHF) can be used to undercut the $SiO_2$ and suspend the center part of the patterned single-crystal semiconductor layer 106A. It should be noted that a person having ordinary skill in the art will recognize that the etch chemistry utilized has to be selective with respect to the patterned single-crystal semiconductor layer 106A. Utilizing such selective etch chemistry, for example DHF, will allow etching a pattern in $SiO_2$ without removing portions of the patterned single-crystal semiconductor layer 106A.

Figure 4A:
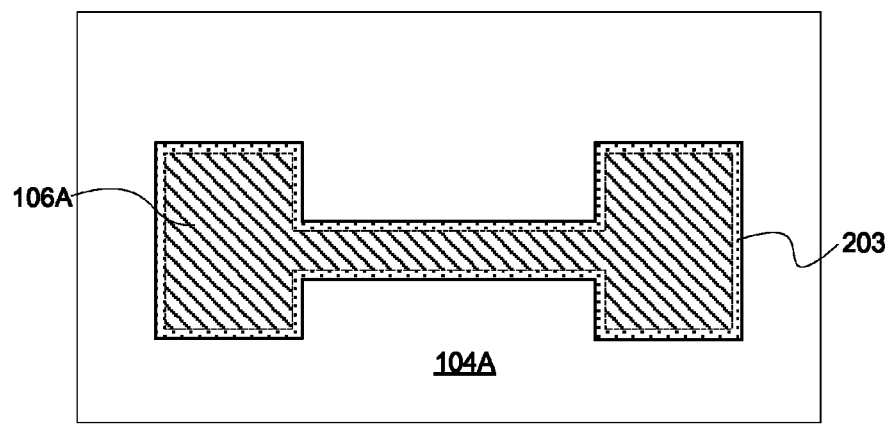
FIG. 4A is a top view and FIG. 4B is a cross sectional schematic view depicting an application of layers on semiconductor device, according to an embodiment of the present disclosure.
Figure 4B:
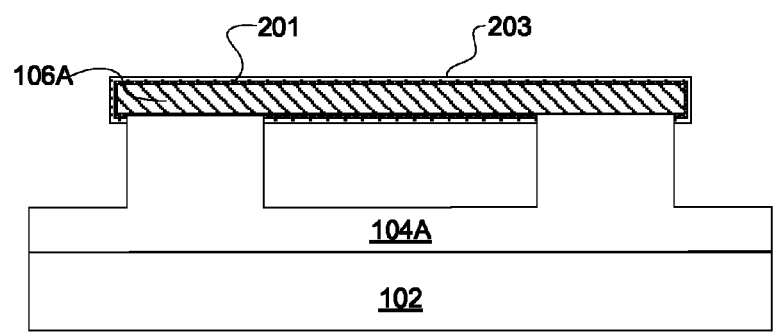

FIG. 4A is a top view and FIG. 4B is a cross sectional schematic views depicting an application of layers on semiconductor device, according to an embodiment of the present disclosure. In an embodiment, a wide bandgap semiconductor inner gate dielectric layer 201 may be epitaxially grown and wrapped around the suspended portion of the patterned single-crystal semiconductor layer 106A. The wide bandgap semiconductor inner gate dielectric layer 201 serves may serve as a gate dielectric. In an embodiment in which the patterned single-crystal semiconductor layer 106A is composed of $In_{0.53}Ga_{0.47}As$, the inner gate dielectric layer 201 may be $In_xAl_{1-x}As$. When x=0.5 $In_xAl_{1-x}As$ is latticed matched to $In_{0.53}Ga_{0.47}As$.

The inner gate dielectric layer 201 may be very thin, having a thickness of less than 3 nm. Accordingly, the wide bandgap inner gate dielectric layer 201 may be grown strained with a larger Al content to allow for a wider bandgap. In an embodiment in which x=1, the bandgap (i.e., the energy separation between Γ conduction band minima and top of the valence band) can be as large as 2.95 eV. Other wide bandgap materials such as phosphides or nitrides may be used. For example, GaP has a bandgap of 2.26 eV, and AlN has a bandgap of about 6.2 eV. Alloys, such as ZnCdSe or $Zn_xCd_yMg_{1-x-y}Se$ may be particularly utilized as wide bandgap material for inner gate dielectric layer 201 since they may be grown latticed matched to InP, and have a bandgap of 2.1 to 2.9 eV with a conduction band offset as large as 80%. In an embodiment, the growth of inner gate dielectric layer 201 may be accomplished by using a chemical vapor deposition (CVD) or an atomic layer deposition (ALD) methods allowing for a conformal deposition of the layer. These methods may also allow for the selective deposition of the wide bandgap material for inner gate dielectric layer 201. Selective deposition may be described as application of the wide bandgap material forming the of the inner gate channel layer 201 only over the patterned single-crystal semiconductor layer 106A. In other words, no deposition takes place over the dielectric layer 104.

In another embodiment, the growth of the inner gate dielectric layer 201 can be done using a metal-organic chemical vapor deposition (MOCVD) reactor with trimethylindium (TMIn) as the indium source, trimethylgallium (TEG) as the gallium source, arsine ($AsH_3$) as the arsenic source, phosphine ($PH_3$) as the phosphorus source and trimethylaluminum (TMA) as a source for aluminum. In this embodiment, the growth temperatures may typically range from 400° C. to 650° C.

A narrow bandgap semiconductor channel layer 203 may be epitaxially grown so as to conform to the inner gate dielectric layer 201. The narrow bandgap semiconductor channel layer 203 may serve as the device channel. In an embodiment, the channel layer 203 may be composed of $In_{0.53}G_{0.47}$. Other high mobility carrier semiconductors such as InAs may also be utilized. In an embodiment, the growth of the inner gate dielectric layer 201 and the channel layer 203 may be preformed sequentially in the same growth chamber without breaking the vacuum.

Figure 5A:
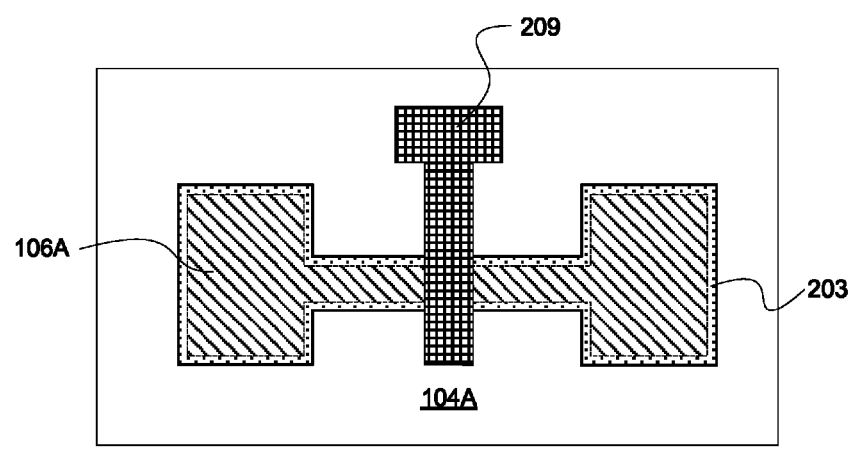
FIG. 5A is a top view and FIG. 5B is cross sectional schematic view depicting an outer gate dielectric layer deposition on semiconductor device, according to an embodiment of the present disclosure.
Figure 5B:
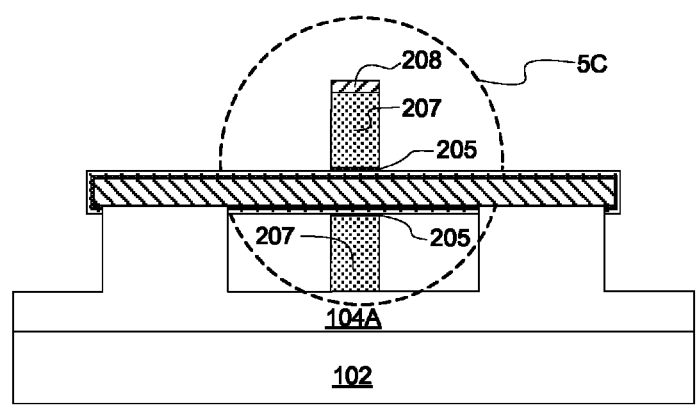

FIG. 5A is a top view and FIG. 5B is a cross sectional schematic view depicting an outer gate dielectric layer deposition on the semiconductor device, according to an embodiment of the present disclosure. FIG. 5A depicts the top view of the outer gate after deposition of a second dielectric layer 205, a gate conductor 207, and the definition of a gate line 208. A hard mask 209 may be used to pattern and define the gate line 208 using a method of etching such as RIE. The details of the layer deposition between channel layer 203 and inner gate 106A are described in more details in FIG. 5C.

FIG. 5B depicts an outer gate dielectric layer 205 which may be deposited over the channel layer 203 (depicted in FIG. 4B). The outer gate dielectric layer 205 can be epitaxially deposited similarly to the inner gate dielectric 201, described previously. Alternatively, an amorphous gate dielectric material, such as $HfO_2$ or $Al_2O_3$, may be used. A gate conductor layer 207 may be formed using a conformal deposition over the outer gate dielectric layer 205. The gate line 208 may be then formed by conventional techniques, such as lithography and RIE. The gate line 208 may define the channel region of the device. In an exemplary embodiment of the invention, the RIE process used to define the gate line 208 may be performed in two stages. In the first stage, directional (anisotropic) etching may be used to define the gate line 208 with near vertical sidewalls. Utilizing the directional etch technique, however, does not clear the gate stack material under the suspended structure in areas outside the channel region. The second stage of the RIE is therefore utilized, using a more isotropic etch that trims the gate line but also undercuts and removes the gate material under the portions of the suspended structure outside the channel region. The gate line 208 may be capped with the hard mask 209, which may be made of a dielectric such as $Si_3N_4$.

Figure 5C:
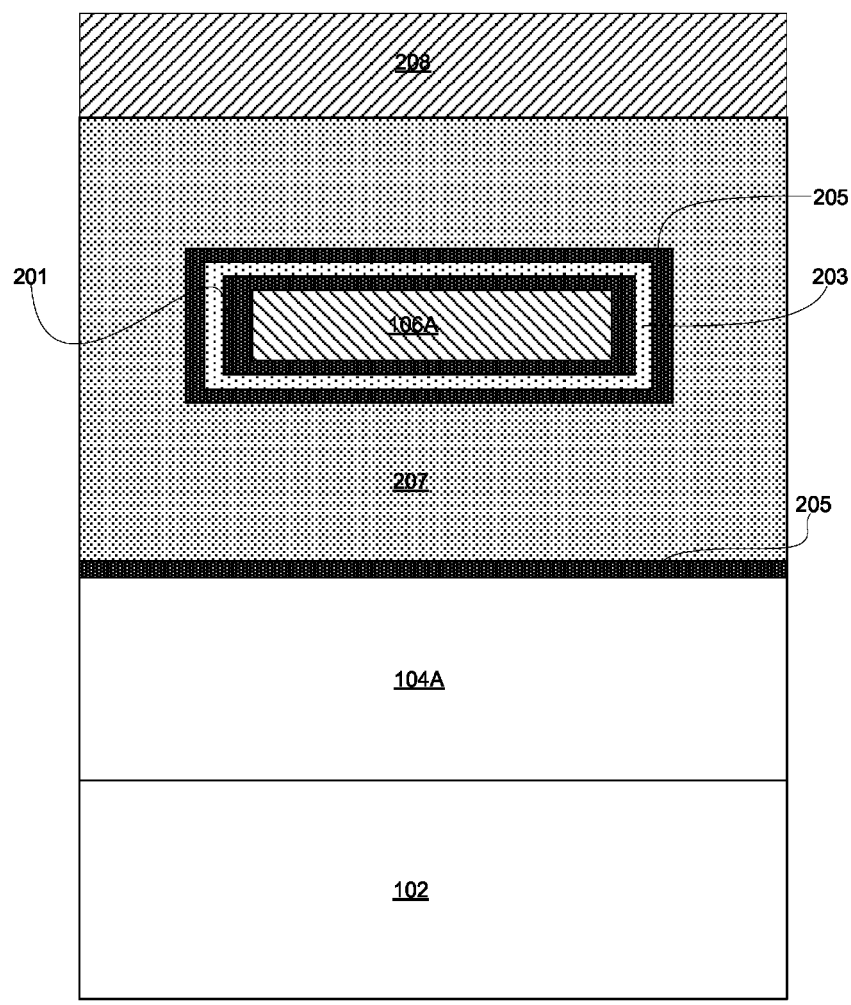
FIG. 5C is a cross sectional schematic view of the outer and inner gate, according to an embodiment of the invention.

FIG. 5C is a cross sectional schematic view of the outer and inner gate, according to an embodiment of the invention. The outer gate may comprise an outer gate dielectric layer 205 in direct contact with, and surrounding on all sides of, the channel layer 203. The channel layer 203 may be in direct contact with, and deposited so that it may surround the inner gate dielectric layer 201 on all directions. The inner gate dielectric layer 201 may be directly deposited onto, and may be in direct contact with, the patterned single-crystal semiconductor layer 106A. The gate conductor layer 207 may be formed using a conventional conformal deposition over the outer gate dielectric layer 205. The gate line 208 may be capped with a hard mask 209 material directly deposited onto the gate conductor layer 207.

Figure 6A:
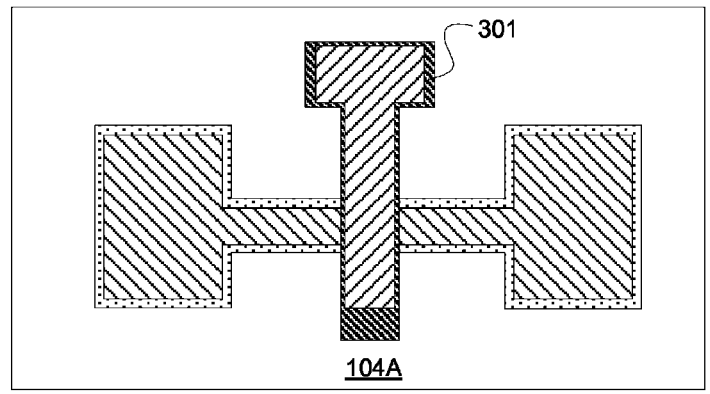
FIG. 6A is a top view and FIG. 6B is a cross sectional schematic view depicting deposition of sidewall spacers on a semiconductor device, according to an embodiment of the present disclosure.
Figure 6B:
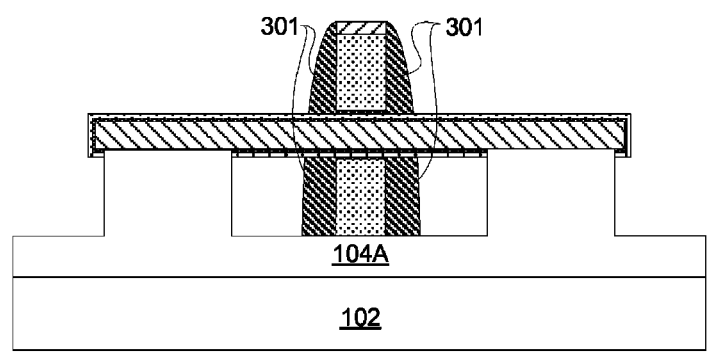

FIG. 6A is a top view and FIG. 6B is a cross sectional schematic view depicting deposition of sidewall spacers on a semiconductor device, according to an embodiment of the present disclosure. Sidewall spacers 301 may be formed adjacent to the gate line 208 (depicted in 5C). The spacers may be formed by first depositing a dielectric layer such as $SiO_2$ or $Si_3N_4$ and then performing a directional etch such as RIE to remove the dielectric layer from horizontally planar surfaces. Vertical surfaces may therefore be left covered with a dielectric sidewall composed of the sidewall spacers 301. It should be noted that the sidewall spacers 301 depicted in FIGS. 6A and 6B, are for illustration purposes and generally can have a slightly different shape from those shown. For example, the sidewall spacers 301 can have different shape corners that can be naturally formed during the directional etching process as is known in the art.

Figure 7A:
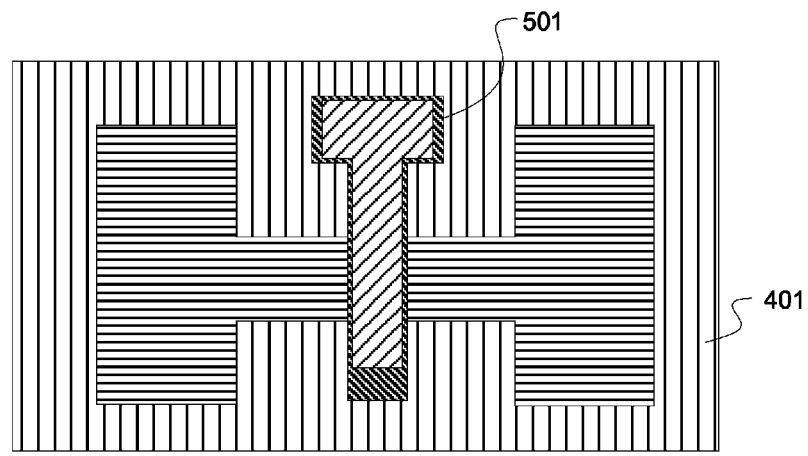
FIG. 7A is a top view and FIG. 7B is a cross sectional schematic view depicting deposition of a heavily doped semiconductor layer on a semiconductor device, according to an embodiment of the present disclosure.
Figure 7B:
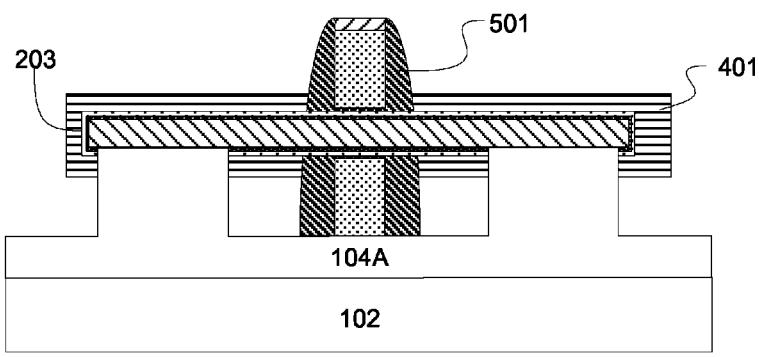

FIG. 7A is a top view and FIG. 7B is a cross sectional schematic view depicting deposition of a heavily doped semiconductor layer on a semiconductor device, according to an embodiment of the present disclosure. A heavily doped semiconductor layer 401 may be epitaxially deposited over the exposed regions of channel layer 203 extending outside the channel region as defined by the gate line 208 (depicted in 5C). In an exemplary embodiment, the heavily doped semiconductor layer 401 may be formed from $In_{0.53}Ga_{0.47}As$ and may be doped with silicon to achieve n-type doping. In-situ silicon doping may be practiced during the deposition of the $In_{0.53}Ga_{0.47}As$ layer. In an embodiment, MOCVD growth may be used to form the heavily doped semiconductor layer 401 and silane ($SiH_4$) may be added to the gas mixture during the growth of to obtain Si doping. Other precursors that may be used are silicon tetrabromide ($SiBr_4$) and silicon tetrachloride ($SiCl_4$). It should be noted that a person having ordinary skill in the art will recognize that the deposition of the heavily doped semiconductor layer 401 is selective so the material of the heavily doped semiconductor layer 401 is only added over channel layer 203 and no deposition takes place over dielectric film 104A or sidewall spacers 301.

Figure 8A:
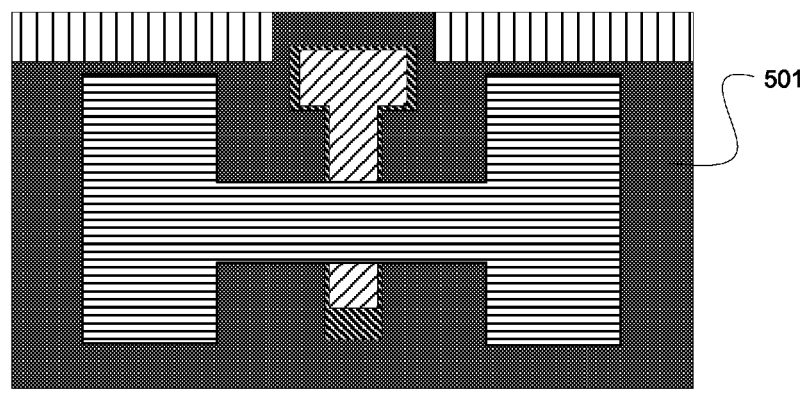
FIG. 8A is a top view and FIG. 8B is a cross sectional schematic view depicting deposition and etching of a spacer on a semiconductor device, according to an embodiment of the present disclosure.
Figure 8B:
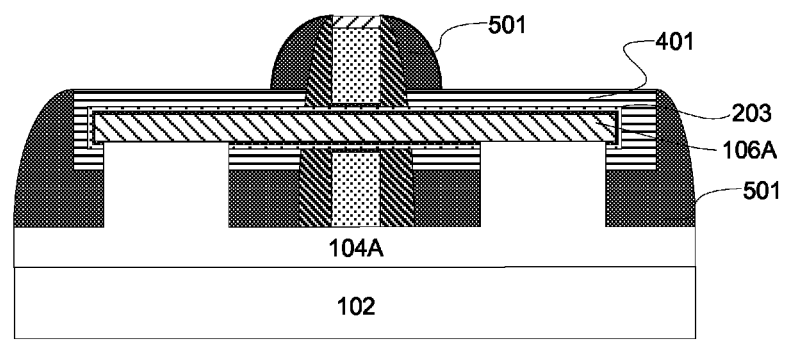

FIG. 8A is a top view and FIG. 8B is a cross sectional schematic view depicting deposition and etching of a spacer on a semiconductor device, according to an embodiment of the present disclosure. A dielectric layer (not shown) may be blanket deposited over the wafer and etched back to form a wide spacer 501. Examples of dielectric material that may be used to form the dielectric layer include $Si_3N_4$, $SiO_2$, a spin-on-glass (SOG), or a low-K dielectric. The dielectric material for wide spacer 501 should be chosen as to allow for an adequate filling under the suspended portion of the device, including the support opening 300 (FIGS. 3A and 3B). The width of the wide spacer 501 may be defined by the size of the device source and drain regions.

Figure 9A:
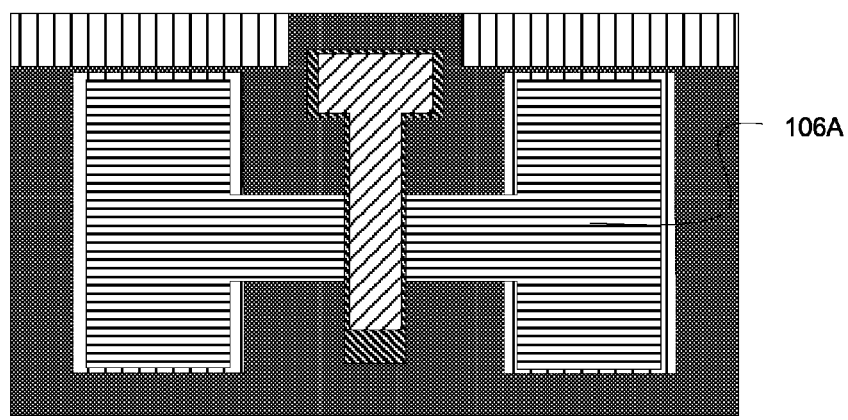
FIG. 9A is a top view and FIG. 9B is a cross sectional schematic view depicting etching of dielectric material on a semiconductor device, according to an embodiment of the present disclosure.
Figure 9B:
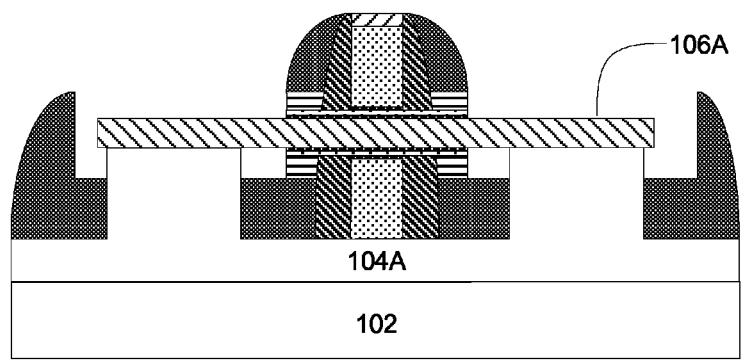

FIG. 9A is a top view and FIG. 9B is a cross sectional schematic view depicting etching of dielectric material on a semiconductor device, according to an embodiment of the present disclosure. Utilizing several conventional isotropic etching steps, portions of layers 401, 203 and 201 may be selectively removed with respect to the inner gate layer 106A. In an embodiment, the portions of the layers 401, 203 and, 201, that are removed may be in regions not covered by the wide spacer 501.

Figure 10A:
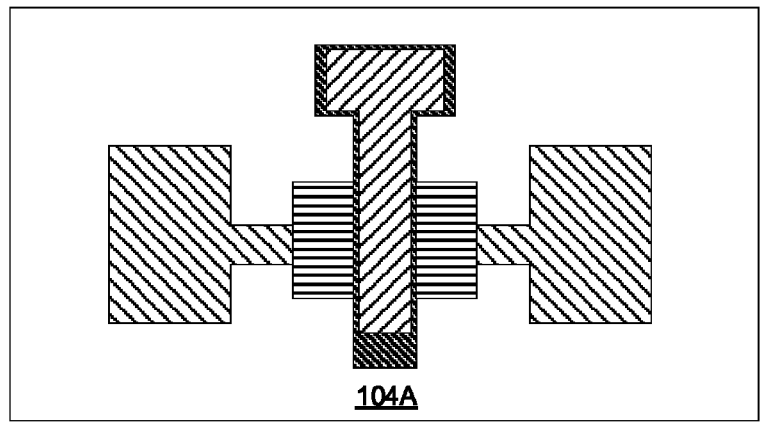
FIG. 10A is a top view and FIG. 10B is a cross sectional schematic view depicting etching of dielectric material on a semiconductor device, according to an embodiment of the present disclosure.
Figure 10B:
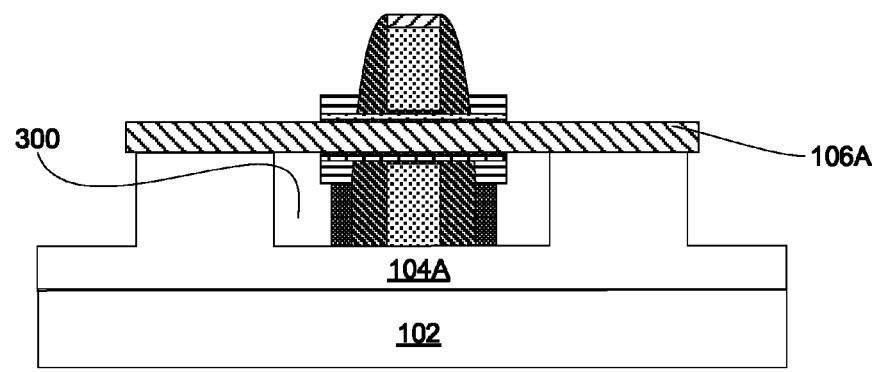

FIG. 10A is a top view and FIG. 10B is a cross sectional schematic view depicting regions of recessed dielectric material on a semiconductor device, according to an embodiment of the present disclosure. The dielectric material of wide spacer 501 is recessed, exposing inner gate layer 106A, and support opening 300 located on dielectric film 104A. The removal of wide spacer 501 can be accomplished by utilizing a wet etching process that is selective with respect to gate layer 106A and layer 401. For example, if wide spacer 501 is formed of $SiO_2$, then diluted HF can be used to recess wide spacer 501.

Figure 11A:
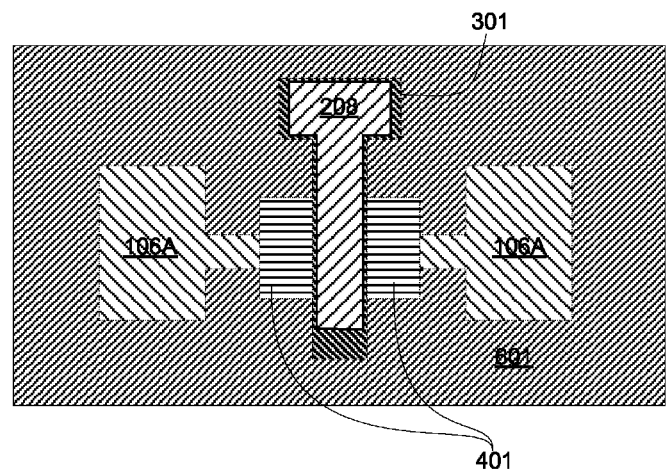
FIG. 11A is a top view and FIG. 11B is cross sectional schematic view depicting deposition of a planarizing dielectric on a semiconductor device, according to an embodiment of the present disclosure.
Figure 11B:
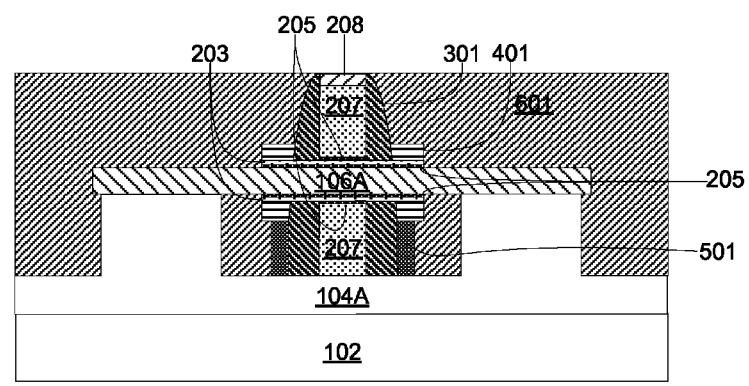

FIG. 11A is a top view and FIG. 11B is a cross sectional schematic view depicting deposition of a planarizing dielectric on a semiconductor device, according to an embodiment of the present disclosure. A planarizing dielectric 601 is deposited over the wafer covering the entire wafer including the previously exposed inner gate layer 106A, and support opening 300 located on dielectric film 104A. Layer 601 may be formed of a low-k dielectric and may be deposited by methods such as CVD. Alternatively, layer 601 may be deposited by spin coating of the dielectric and planarized using chemical mechanical polishing (CMP). The CMP slurry may be chosen such that it has a minimal polish rate with respect to gate line 208 in order to polish layer 601 and stop on gate line 208.

Figure 12A:
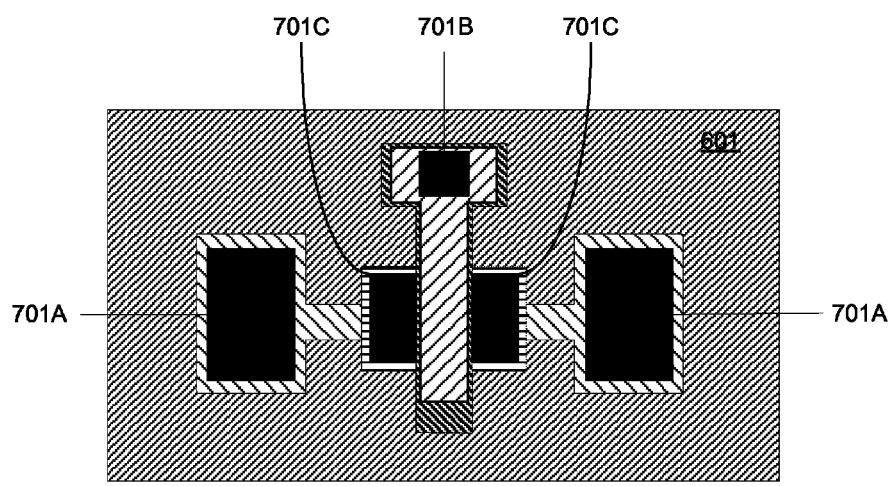
FIG. 12A is a top view and FIG. 12B is cross sectional schematic view depicting formation of contacts on a semiconductor device, according to an embodiment of the present disclosure.
Figure 12B:
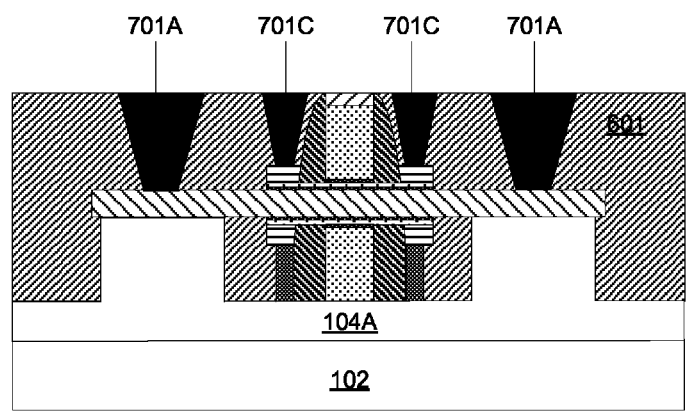

FIG. 12A is a top view and FIG. 12B is a cross sectional schematic view depicting formation of contacts on a semiconductor device, according to an embodiment of the present disclosure. In an embodiment, contacts 701A may be formed in the planarizing dielectric 601 in direct contact with the inner gate layer 106A, outer gate 701B (FIG. 12A) and source and drain (701C). The contacts 701A may be formed using standard via etch and metal fill followed by metal polish. Fabrication of each contact may include multiple process steps and generally conclude with a chemical mechanical polishing (CMP) step used to remove excess material and prepare the surface of a planarizing dielectric to accept succeeding contacts.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A semiconductor device comprising:
    a suspended semiconductor nanowire inner gate;
    a first epitaxial dielectric layer surrounding the suspended semiconductor nanowire inner gate;
    an epitaxial semiconductor channel surrounding the first epitaxial dielectric layer;
    a second dielectric layer surrounding the epitaxial semiconductor channel;
    a gate conductor surrounding the second dielectric layer, wherein the gate conductor is patterned into a gate line to define a channel region overlapping the gate line; and
    a source-drain region adjacent to the gate line.

2. The semiconductor device of claim 1, further comprising a doped semiconductor layer in contact with at least a portion of the suspended semiconductor nanowire inner gate, wherein the doped semiconductor layer comprises InGaAs.

3. The semiconductor device of claim 1, wherein the first epitaxial dielectric layer is one of InAlAs, AlN, ZnCdSe, or $Zn_xCd_yMg_{1-x-y}Se$.

4. The semiconductor device of claim 1, wherein the epitaxial semiconductor channel is comprised of a narrow bandgap material.

5. The semiconductor device of claim 1, wherein the source-drain region comprises heavily doped InGaAs.

6. The semiconductor structure of claim 2, further comprising:
    a first spacer layer in mechanical contact with a first sidewall of the gate line, wherein a portion of the first spacer layer is between the doped semiconductor layer and the outer gate line; and
    a second spacer layer in mechanical contact with a second sidewall of the gate line, wherein a portion of the second spacer layer is between the doped semiconductor layer and the outer gate electrode;
    wherein a length of the first space layer and a length of the second spacer layer are substantially parallel to a width of the substrate layer.

7. The semiconductor structure of claim 2, further comprising:
    a first wide spacer layer in mechanical contact with a sidewall of the first spacer layer below a bottom surface of the doped semiconductor layer;
    a second wide spacer layer in mechanical contact with a sidewall of the second spacer layer below the bottom surface of the doped semiconductor layer;
    wherein a length of the first wide spacer and a length of the second wide spacer layer are substantially parallel to a width of the substrate layer.

8. The semiconductor structure of claim 1, wherein the gate structure further comprises:
    a hard mask layer directly above and in mechanical contact with a top surface of the gate line.

9. The semiconductor structure of claim 1, wherein the semiconductor nanowire inner gate comprises a single-crystal semiconductor.

10. The semiconductor structure of claim 1, further comprising:

a planarizing dielectric layer in direct mechanical contact with exposed surfaces of the nanowire layer, and the gate line.

11. The semiconductor structure of claim 10, further comprising:
- a first contact layer in the planarizing dielectric layer having a bottom surface in electrical contact with a top surface of the doped semiconductor layer adjacent to a first sidewall of the gate line;
- a second contact layer in the planarizing dielectric layer having a bottom surface in electrical contact with a top surface of the doped semiconductor layer adjacent to a second sidewall of the gate line;
- a third contact layer in the planarizing dielectric layer having a bottom surface in electrical contact with a top surface the suspended semiconductor nanowire inner gate adjacent to the first sidewall of the gate line; and
- a fourth contact layer in the planarizing dielectric layer having a bottom surface in electrical contact with a top surface the suspended semiconductor nanowire inner gate adjacent to the second sidewall of the gate line.

* * * * *